(12) United States Patent
Deeds et al.

(10) Patent No.: US 9,390,061 B1
(45) Date of Patent: Jul. 12, 2016

(54) ENVIRONMENTALLY COMPENSATED CAPACITIVE SENSOR

(71) Applicants: Michael Deeds, Port Tobacco, MD (US); Gregory Kaminski, Waldorf, MD (US)

(72) Inventors: Michael Deeds, Port Tobacco, MD (US); Gregory Kaminski, Waldorf, MD (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 820 days.

(21) Appl. No.: 13/694,292

(22) Filed: Nov. 16, 2012

(51) Int. Cl.
*G06F 17/00* (2006.01)
*G01R 27/26* (2006.01)

(52) U.S. Cl.
CPC .......... *G06F 17/00* (2013.01); *G01R 27/2605* (2013.01)

(58) Field of Classification Search
CPC ........................... G06F 17/00; G01R 27/2605
See application file for complete search history.

(56) References Cited

U.S. PATENT DOCUMENTS

| | | | |
|---|---|---|---|
| 4,586,260 A | 5/1986 | Baxter et al. | |
| 4,683,754 A | 8/1987 | Hirata et al. | |
| 4,793,187 A | 12/1988 | Kordts et al. | |
| 5,291,534 A * | 3/1994 | Sakurai | G01D 3/0365 327/509 |
| 5,424,973 A | 6/1995 | Shou et al. | |
| 7,279,761 B2 | 10/2007 | Acar et al. | |
| 8,125,227 B2 * | 2/2012 | Gao | G01D 3/032 324/300 |

* cited by examiner

*Primary Examiner* — Phuong Huynh
(74) *Attorney, Agent, or Firm* — Fredric J. Zimmerman

(57) ABSTRACT

A movable capacitive sensing component and plural stationary capacitive sensing components are similarly constructed and are located together. The movable capacitive sensing component includes two interdigitated electrode elements at least one of which moves in accordance with displacement of an object. The stationary capacitive sensing components includes two interdigitated electrode elements that do not move, and differ from each other in terms of relative displacement between the fixed electrode elements. The movable capacitive sensing component measures a capacitance value. Another capacitance value is estimated, from the capacitance values measured by the stationary capacitive sensing components, for the displacement indicated by the movable capacitive sensing component's measured capacitance value. The actual displacement of the object is found by subtracting the respective capacitance values and converting this result to displacement, or by converting the respective capacitance values to displacement and subtracting the respective displacement values.

11 Claims, 11 Drawing Sheets

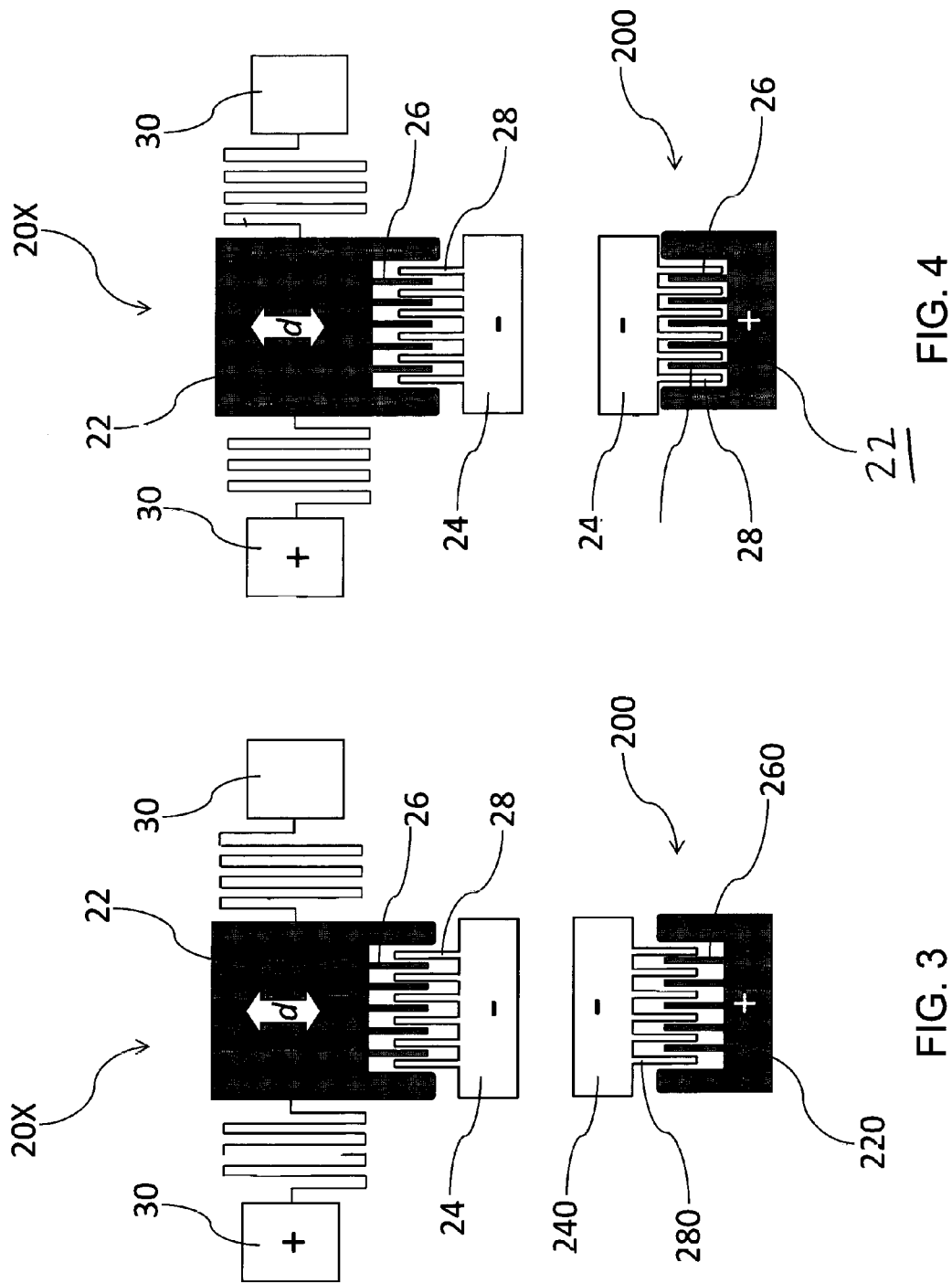

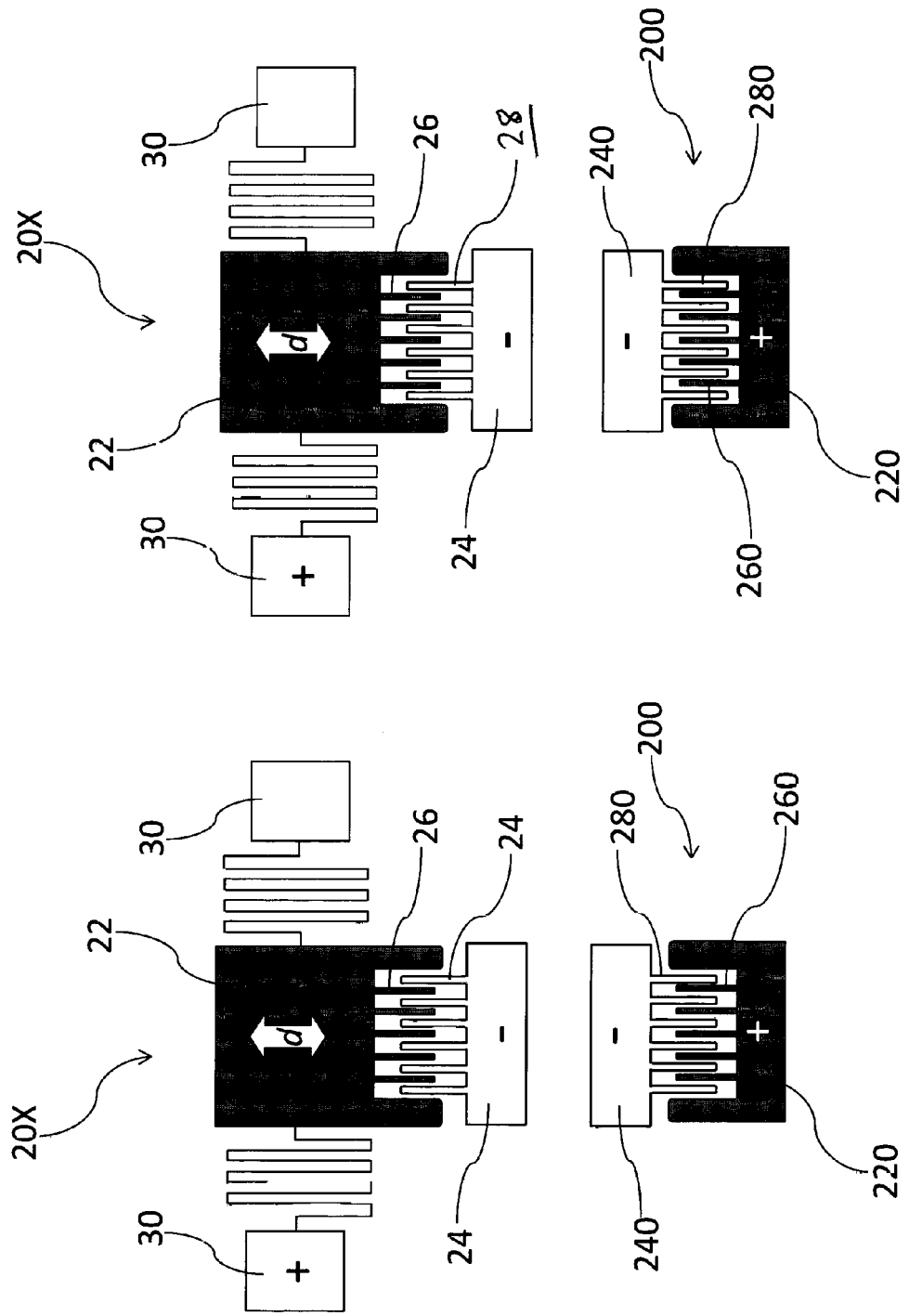

ENVIRONMENTALLY COMPENSATED CAPACITIVE SENSOR

BACKGROUND OF THE INVENTION

The present invention relates to capacitive sensors, more particularly to methods and devices for identifying or neutralizing, in capacitive sensors, measurement errors involving offset drifts associated with environmental factors such as temperature and humidity.

A capacitive displacement sensor as conventionally known is a noncontact device that uses the electrical property known as "capacitance" to measure position, and/or change of position, of a conductive target. The capacitance that is implemented by a capacitive displacement sensor is that which exists between two conductive surfaces that are sufficiently near each other to establish a capacitance therebetween. The capacitance varies in accordance with variation of the distance between the two conductive surfaces. Therefore, a change in capacitance is indicative of a change in position of a conductive target. For instance, a change in capacitance can translate into a distance measurement.

Diverse applications of capacitive displacement sensors include processing, precision assembly, precision measurement, metrology, etc. A capacitive sensor can be used, for example, in association with a fuze, safety, or arming device. Some conventionally known capacitive sensors are of a MEMS (micro-electromechanical system) variety, for instance machined in silicon and used for various MEMS applications such as measuring acceleration or rotation in an automobile or toy (e.g., a video game controller).

Conventional capacitive sensors are frequently designed to be to "zeroed" to eliminate a constant offset error (e.g., in which a constant value is added to the output voltage) with respect to the original calibration. For instance, these sensors often have the capability to be initialized upon power up through a self-calibration process and polling. However, after the device is zeroed, other kinds of offset error may be introduced into the capacitive sensing due to environmental factors such as temperature and humidity. The device may be subject to offset drift caused by these and other environmental factors and changes thereto over time.

Conventional approaches to compensating for environmental effects involve integration of a capacitive sensor with temperature and/or humidity sensors. Since the temperature and humidity sensors necessitate additional hardware and software, these approaches to environmental compensation may not be suited for some applications, such as safety-critical or volume-critical applications. Moreover, some applications, such as weapon safety systems, are not amenable to powered self-calibrations or polling; in these systems, the device is powered and the sensors report back the status.

It may be the case, for a given application, that an environmentally uncompensated capacitive sensor is adequate insofar as meeting the fidelity requirements of the application. Nevertheless, many applications require higher fidelity, and hence compensation for environmental effects is needed. The importance of compensation for offset drift lies in the fact that significant offset drift can be misinterpreted as a change in the physical quantity to be measured, rather than being correctly interpreted as an electrical bias of an uninfluenced sensor. Accordingly, an improved methodology is sought that captures or negates offset drift that is associated with environmental effects.

SUMMARY OF THE INVENTION

In view of the foregoing, it is an object of the present invention to provide method and apparatus for neutralizing or adjusting for offset drifts in capacitive sensors, especially offset drifts that are attributable to environmental conditions. The present invention, inexemplary embodiments, corrects for offset drift of capacitive sensors. Exemplary inventive embodiments also correct for sensitivity changes. Inventive practice may be especially propitious in performing capacitive sensing at MEMS scales.

An exemplary embodiment of the present invention features, inter alia: a displaceable capacitive sensing component and plural non-displaceable sensing components, all closely situated and similarly constructed; capacitance measurement by the displaceable capacitive sensing component; capacitance estimation (e.g., including extrapolation and/or interpolation) based on the capacitance measurements by the non-displaceable capacitive sensing components, and corresponding to the displacement indicated by the capacitance measurement by the displaceable capacitive sensing component; in some inventive embodiments, a capacitance estimation range between zero displacement and total displacement (such as when a first non-displaceable capacitive sensing component is set at zero displacement, and a second non-displaceable capacitive sensing component is set at total displacement); determination of the "actual" displacement through subtraction of the estimated non-displaceable sensing capacitance from the measured displaceable sensing capacitance (or, equivalently, through subtraction of the estimated non-displaceable sensing displacement from the measured displaceable sensing displacement); the "actual" displacement reflecting correction for environmental influences (e.g., temperature and humidity) and sensitivities (e.g., depending on the amount of displacement).

An exemplary inventive embodiment of an environmentally compensated capacitive sensing device comprises a primary capacitive sensor, at least two secondary capacitive sensors, and a computer. The primary capacitive sensor has two electrode elements at least one of which is displaceable in accordance with displacement of a target object. Each secondary capacitive sensor has two non-displaceable electrode elements. The sensing performed by the primary capacitive sensor is indicative of the displacement of the target object and of environmental influence upon the capacitive sensing device. The sensing performed by the secondary capacitive sensors is not indicative of the displacement of the target object, but is indicative of the environmental influence.

The computer is capable of determining the difference between a measured electrical value and an estimated electrical value. The measured electrical value is representative of the sensing performed by the primary capacitive sensor. The estimated electrical value is representative of the sensing performed by the secondary capacitive sensors. The estimated electrical value corresponds to the displacement of the target object of which the primary capacitive sensor is indicative. The difference (between the measured electrical value and the estimated electrical value) reflects sensing performed by the capacitive sensing device that is indicative of the displacement of the target object, but is not indicative, or is substantially not indicative, of the environmental influence. The computer is further capable of determining the corrected (compensated) displacement of the target object, based on the determined difference (between the measured electrical value and the estimated electrical value).

The present invention, as generally practiced, introduces plural compensation capacitive sensors to complement the original capacitive sensor. Each'compensation capacitive sensor is static (unmoving). The static capacitive sensors are used to correct for changes in the offset bias, whereby changes in the local or global temperature and humidity are negated. The present invention's estimative relationship between capacitance and displacement over a range of displacements is based on measurements by compensation capacitive sensors, and imparts compensation for sensitivity differences that are associated with the degree of displacement. The original capacitive sensor measurement is compared to the compensation sensor estimate to compute, differentially, the distance traveled by the target object. According to some inventive embodiments, the actual offset is not known, but is manifested in effect, through the zeroing. In addition to negating environmental effects, the present invention can be practiced so as to reduce noise through the subtraction of signals.

The present invention succeeds, within a single system, in compensating for any environment and for sensitivity differences. The dynamic capacitive sensor is sensitive to displacement and to environment. Each of the static capacitive sensors is insensitive to displacement but is sensitive to environment. The inventive estimation of the static capacitive sensors' measured capacitance carries sensitivity compensation. An exemplary inventive system does not require independent calibrations and adjustments of different types of sensors (e.g., temperature sensors). In exemplary inventive practice, neither the dynamic capacitive sensor nor the static capacitive sensors need to be powered or actuated for calibration. Furthermore, the proximate locating together of all of the capacitive sensors—viz., the dynamic capacitive sensor and the static capacitive sensors—is beneficial in applications characterized by significant local heat sources, such as thermal actuators.

BRIEF DESCRIPTION OF THE DRAWINGS

The present invention will now be described, by way of example, with reference to the accompanying drawings, wherein like numbers indicate same or similar parts, components, or elements, and wherein:

In FIG. 1, the conventional capacitive sensor is shown in the zero-displacement condition. In FIG. 2, the conventional capacitive sensor is shown in the total-displacement condition.

FIGS. 3 through 6 are diagrams of similar embodiments of a "single-reference" capacitive displacement sensor in accordance with the present invention. As depicted in each of FIGS. 3 through 6, the displaceable capacitive sensing component has one fixed element and one movable element, similarly as shown in FIGS. 1 and 2; the non-displaceable capacitive sensing component has two fixed elements, in fixed relation to each other. The non-displaceable capacitive sensing component is shown in the zero-displacement condition in FIG. 3, the total-displacement condition in FIG. 4, a first partial-displacement condition in FIG. 5, and a second partial-displacement condition in FIG. 6.

In FIG. 7, the two non-displaceable capacitive sensing components are shown, respectively, in the zero-displacement condition and the total-displacement condition. In FIG. 8, the four non-displaceable capacitive sensing components are shown, respectively, in the zero-displacement condition, a first partial-displacement condition, a second partial-displacement condition, and the total-displacement condition.

FIG. 9 shows single-reference inventive practice in which a linear extrapolation is effected through the capacitive measurement point of a stationary-electrode capacitive displacement sensor component such as shown in FIG. 6. FIG. 10 shows two-reference inventive practice in which a linear-fit interpolation is performed through the capacitive measurement points corresponding, respectively, to two stationary-electrode capacitive displacement sensor components such as shown in FIG. 7. FIG. 11 shows four-reference inventive practice in which a curved-fit interpolation is performed through the capacitive measurement points corresponding, respectively, to four stationary-electrode capacitive displacement sensor components such as shown in FIG. 8.

FIGS. 12 and 13 illustrate different embodiments of single-reference inventive practice. FIG. 14 is representative of exemplary embodiments of multi-reference inventive practice.

DESCRIPTION OF EXEMPLARY
EMBODIMENTS OF THE INVENTION

Figure 1:
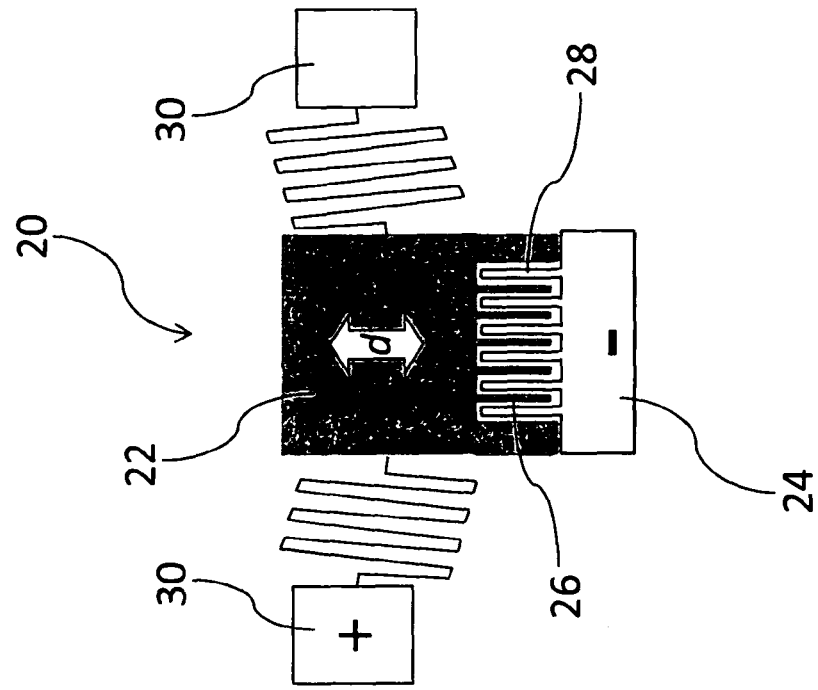
FIG. 1 and FIG. 2 are diagrams of a conventional capacitive displacement sensor having a fixed element and movable element. The conventional capacitive sensor is linearly displaceable between a zero-displacement condition (in which the movable element remains in its starting position, i.e., has not moved at all) and a total-displacement condition (in which the movable element is repositioned to the furthest possible position from its starting position, i.e., has moved maximally).
Figure 2:
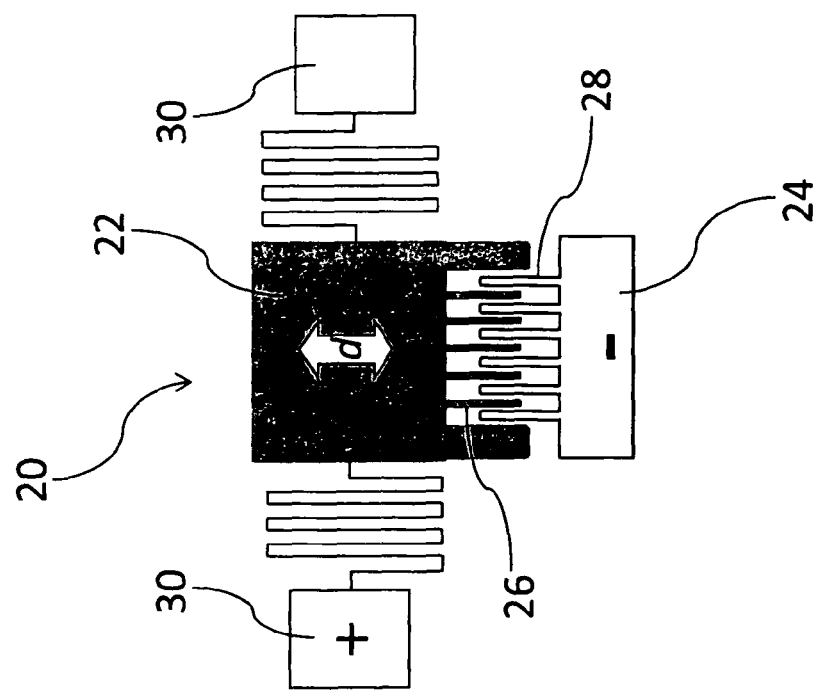

Referring to FIGS. 1 and 2, a conventional capacitive displacement sensor 20 has a "movable-electrode" character. This example of a movable-electrode capacitive sensor 20 includes a movable rigid element 22 (positively charged) and a stationary rigid element 24 (negatively charged). Movable element 22 has electrode fingers 26. Fixed element 24 has electrode fingers 28. Movable fingers 26 and stationary fingers 28 are in an interdigitated configuration. Each movable finger 26 is situated between two stationary fingers 28.

Each electrically interactive trio of fingers consists of a pair of stationary fingers 28 and a single movable finger 26 therebetween, and forms two capacitors; that is, one capacitor is formed between movable finger 26 and each of the two stationary fingers 28 between which the movable finger 26 is interposed. Movable element 22 is electrically connected across a dc power supply 30 and is mechanically connected to a target device where the physical displacement of which is being sensed by movable-electrode capacitive sensor 20.

Movable element 22 operates as a kind of "shuttle," linearly and bi-directionally movable (displaceable) in direction d in a range between the completely non-displaced position shown in FIG. 1 and the completely displaced position shown in FIG. 2. Movable element 22 is mechanically connected to the target device in such a way that the distance traveled in direction d by movable element 22 equals the distance traveled in direction d by the target device.

In theory, the capacitance measured by movable-electrode capacitive sensor 20 is commensurate with the d-directional distance traveled by movable element 22, and hence with the d-directional distance traveled by the target device. In practice, however, the capacitance measured by conventional capacitive sensor 20 is skewed, vis-à-vis the d-directional distance actually traveled, due to parasitic, unwanted capacitances caused by ambient influences such as changes in temperature and humidity.

With reference to FIG. 3 through FIG. 15, the present invention compensates for environmental and other capacitive anomalies by complementing a movable-electrode capacitive sensor component 20X with one or more stationary-electrode capacitive sensor components 200. According to the inventive practice, the stationary-electrode capacitive sensor component(s) 200 act(s) as a reference component serving an anomaly-compensatory function. The MEMS practice of the present invention implements a semiconductor (e.g., silicon) substrate.

FIGS. 3 through 6 show exemplary examples of the invention providing for one movable-electrode capacitive sensor component 20X and one stationary-electrode capacitive sensor component 200, proximate to each other. Movable-electrode capacitive sensor component 20X (shown in FIGS. 3 through 6) is displaceable in direction d and is same as or similar to movable-electrode capacitive sensor 20 (shown in FIGS. 1 and 2). Movable-electrode capacitive sensor component 20X includes a positively charged movable rigid element 22 having electrode fingers 26, and a negatively charged stationary rigid element 24 having electrode fingers 28. Movable fingers 26 and stationary fingers 28 are interdigitated whereby each movable finger 26 is situated between two stationary fingers 28.

Stationary-electrode capacitive sensor component 200 bears some similarity to movable-electrode capacitive sensor component 20X, but is distinguishable in a significant respect. In movable-electrode capacitive sensor component 20X, one set of electrodes is movable and the other set of electrodes is stationary. Stationary-electrode capacitive sensor component 200 notably differs in that, not one, but both sets of its electrodes are stationary. Stationary-electrode capacitive sensor component 200 is fixed in the arrangement of its parts.

Stationary-electrode capacitive sensor component 200 includes a first rigid stationary element 220 (positively charged) and a second rigid stationary element 240 (negatively charged). Stationary element 220 has electrode fingers 260. Stationary element 240 has electrode fingers 280. Stationary fingers 260 and stationary fingers 280 are in an interdigitated configuration. Each stationary finger 260 is situated between two stationary fingers 280.

The inventive exemplary examples shown in FIGS. 3-6 differ from one another in terms of the extent of the fixed displacement of the stationary element 240 with respect to the stationary element 260. The various displacements depicted are complete non-displacement (FIG. 3), different partial displacements (FIGS. 4 and 5), and complete displacement (FIG. 6). Regardless of the degree of displacement characterizing the reference component 200, the inventive concepts are essentially the same.

According to basic principle of typical inventive practice, movable-electrode capacitive sensor component 20X and stationary-electrode capacitive sensor component 200 are analogues and are located near each other; hence, they are subject to the same environmental conditions and reflect equivalent environmental offsets in their respective capacitance measurements. Movable-electrode capacitive sensor component 20X measures the overall capacitance $C_M$—that is, the capacitance attributable to all factors and influences, including displacement characterizing the target device, and environmental properties such as temperature and humidity. In contrast, stationary-electrode capacitive sensor component 200 measures capacitance $C_S$—that is, the capacitance attributable solely to environmental properties such as temperature and humidity.

Stationary-electrode capacitive sensor component 200 is static. Since stationary-electrode capacitive sensor component 200 does not displace at all, the amount of capacitance attributable to the target device's displacement is not contained in its measurement. Therefore, the actual capacitance $C_A$ equals the difference between movable-electrode capacitance $C_M$ and the stationary-electrode capacitance $C_S$. That is, $C_A = C_M - C_S$. The actual capacitance $C_A$ represents the compensated or "true" capacitance, i.e., the capacitance attributable solely to the target device's displacement.

FIG. 3 illustrates a single-reference inventive system in which reference sensor component 200 is at zero displacement. FIG. 6 illustrates a single-reference inventive system in which reference sensor component 200 is at full displacement. FIGS. 4 and 5 each illustrate a single-reference inventive system in which reference sensor component 200 is at a partial displacement. Stationary-electrode capacitive sensor component 200 is nearly identical to movable-electrode capacitive sensor component 20X, except that component 200 has two immovable electrode elements, whereas component 20X has one movable electrode element and one immovable electrode element.

Figure 7:
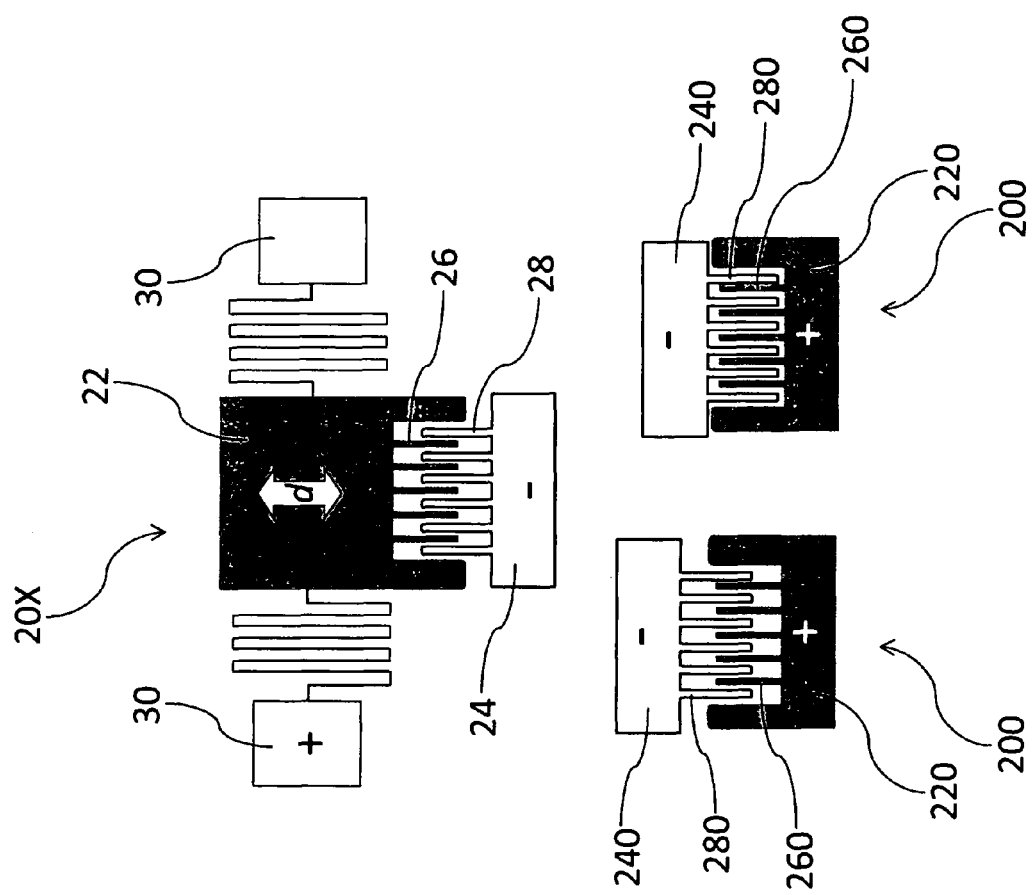
FIGS. 7 and 8 are diagrams of similar embodiments of a "plural-reference" (synonymously referred to herein as "multi-reference") capacitive displacement sensor in accordance with the present invention. As depicted in each of FIGS. 3 through 6, the displaceable capacitive sensing component has one fixed element and one movable element, similarly as shown in FIGS. 1 and 2; each non-displaceable capacitive sensing component has two fixed elements, in fixed relation to each other.
Figure 8:
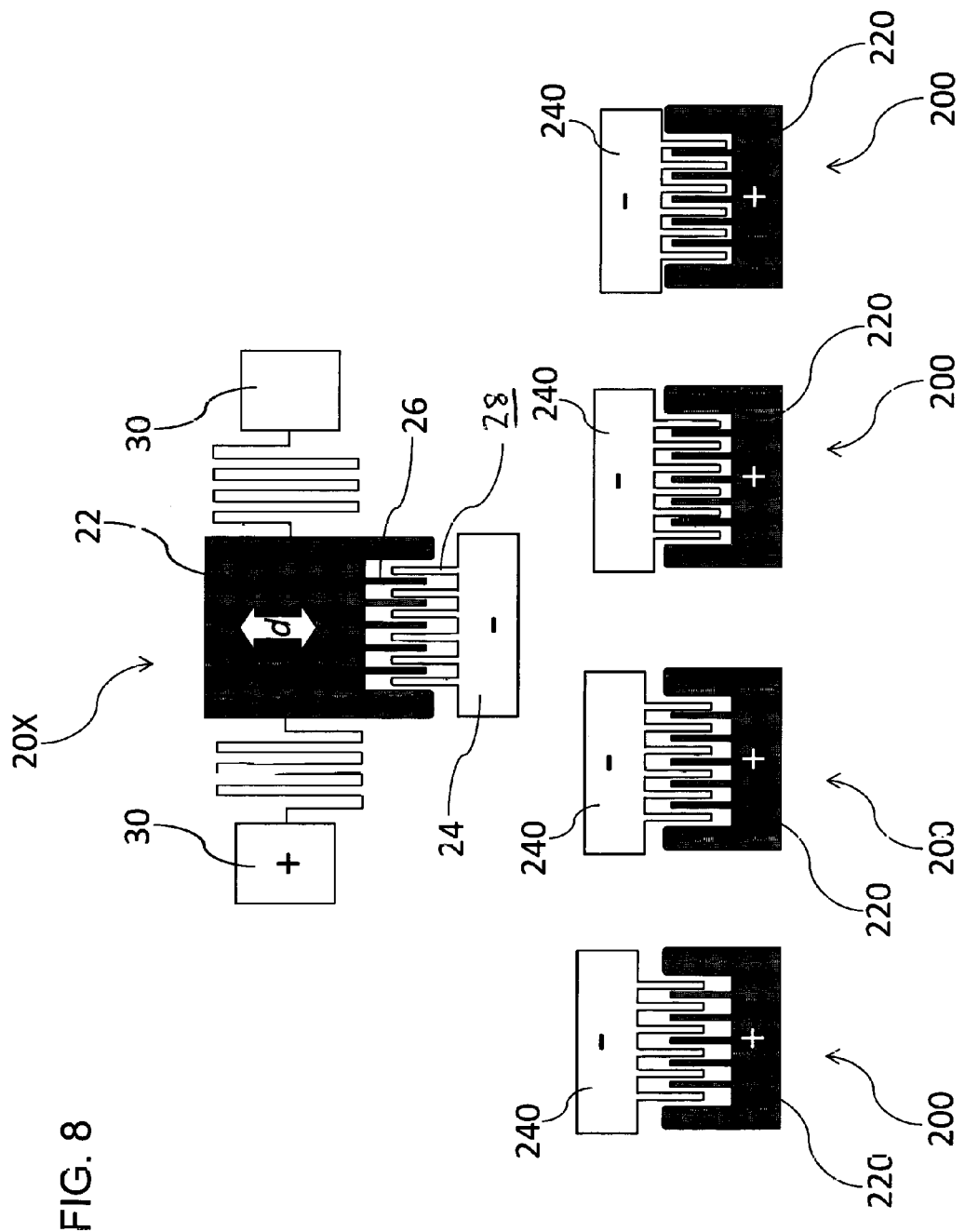

FIG. 7 illustrates a two-reference inventive system in which one reference sensor component 200 is at zero displacement, and the other reference sensor component 200 is at full displacement. FIG. 8 illustrates a four-reference inventive system in which one reference sensor component 200 is at zero displacement, another reference sensor component 200 is at full displacement, another reference sensor component 200 is a partial displacement, and another reference sensor component 200 is a different partial displacement. In each multi-reference inventive system, stationary-electrode capacitive sensor components 200 are identical to each other and are each nearly identical to movable-electrode capacitive sensor component 20X, except that component 200 has two immovable electrode elements, whereas component 20X has one movable electrode element and one immovable electrode element.

Single-reference inventive embodiments such as illustrated in FIGS. 3 through 6 account for environmental conditions, but do not account for differences in sensitivity associated with differences in displacement. The multi-reference inventive embodiments shown in FIGS. 7 and 8 are advantageous insofar as accounting for displacement-dependent variations in sensitivities. In single-reference embodiments of the present invention, target displacements and environmental offsets are included and factored for consideration. In multi-reference embodiments of the present invention, target displacements, environmental offsets, and sensitivity changes are included and factored for consideration.

FIGS. 9, 12, 13, and 15 exemplify inventive computation of actual capacitance $C_A$ in an exemplary single-reference inventive systems. FIGS. 10, 11, 14, and 15 exemplify inventive computation of actual capacitance $C_A$ in exemplary multi-reference inventive systems. Capacitance data points $C_{M0}$, $C_{M1}$, $C_{M2}$, and $C_{M3}$ are measurements taken by movable-electrode capacitive sensor component 20X, and translate to movable-electrode displacements $D_0$, $D_1$, $D_2$, and $D_3$, respectively. In addition, each of at least one capacitance data point represents a measurement taken by a stationary-electrode capacitive sensor 200. Estimation techniques, such as involving interpolation and/or extrapolation, are implemented with respect to the values measured by the stationary-electrode capacitive sensor components 200, thereby determining an estimated continuum of data points within a range of values of displacements. Depending on the inventive embodiment, the estimated continuum of displacement values can extend over the complete range of displacement values (e.g., extend from non-displacement to total displacement), or can extend over a partial range of displacement values. The stationary capacitive sensing components 200 differ from each other insofar as having their respective pairs of electrode elements fixed at different displacements (distances). The estimated stationary-electrode capacitance value represents an estimate of the capacitance measurement, by the stationary capacitive sensing components, at the specific displacement indicated by the movable-electrode capacitance value.

Figure 9:
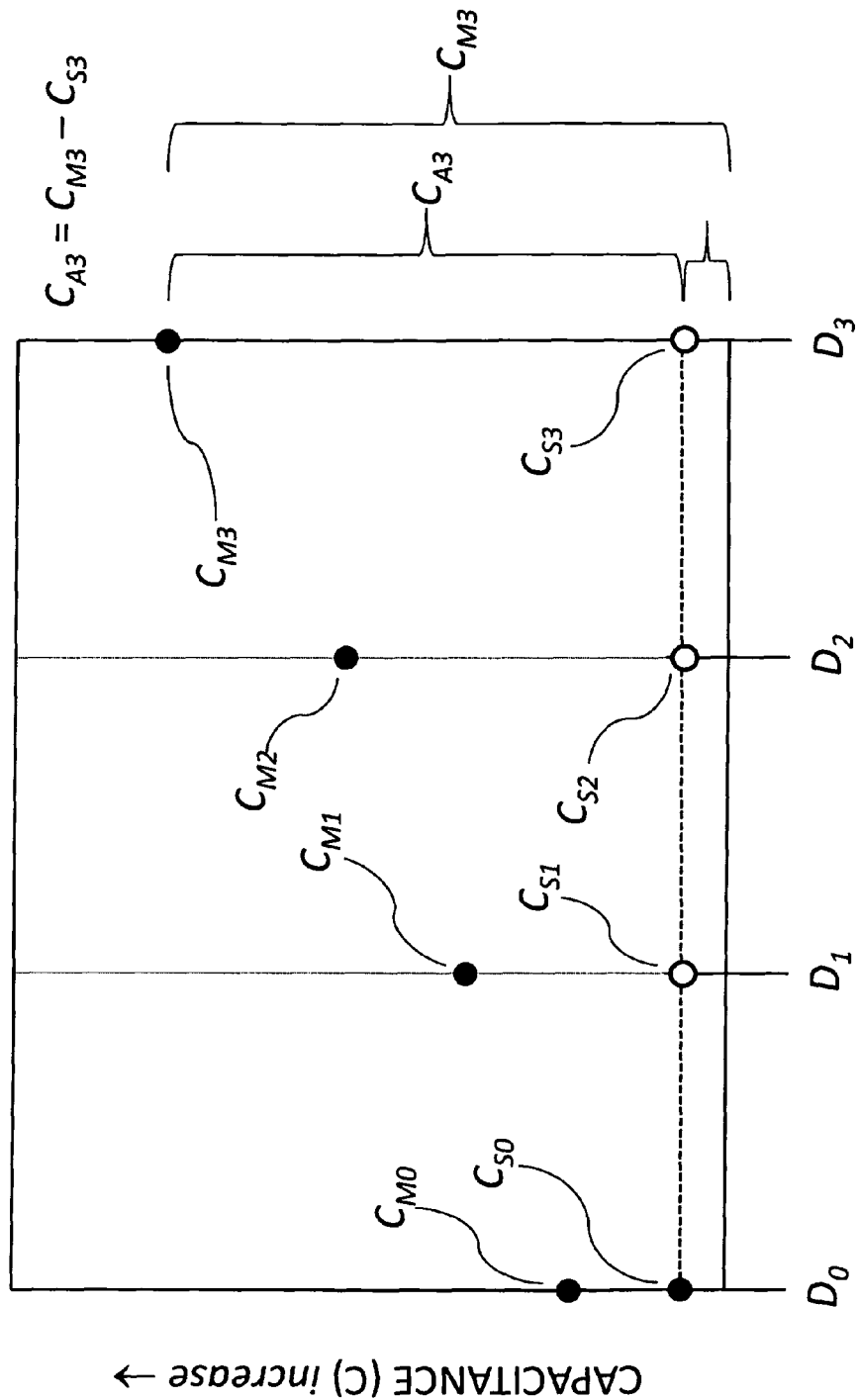
FIGS. 9 through 11 are graphical representations of capacitance versus displacement in accordance with inventive practice such as illustrated in FIGS. 6 through 8, respectively.

As shown in FIG. 9, stationary-electrode capacitive sensor 200 takes capacitance measurement $C_{S0}$, which corresponds to zero movable-electrode displacement $D_0$. The horizontal dashed line is extrapolated from measured stationary-electrode capacitance value $C_{S0}$. Every location on the linear-fit line (e.g., stationary-electrode capacitance values $C_{S1}$, $C_{S2}$, and $C_{S3}$), other than measured data point $C_{S0}$, is an extrapolated value of that measured data point.

Figure 10:
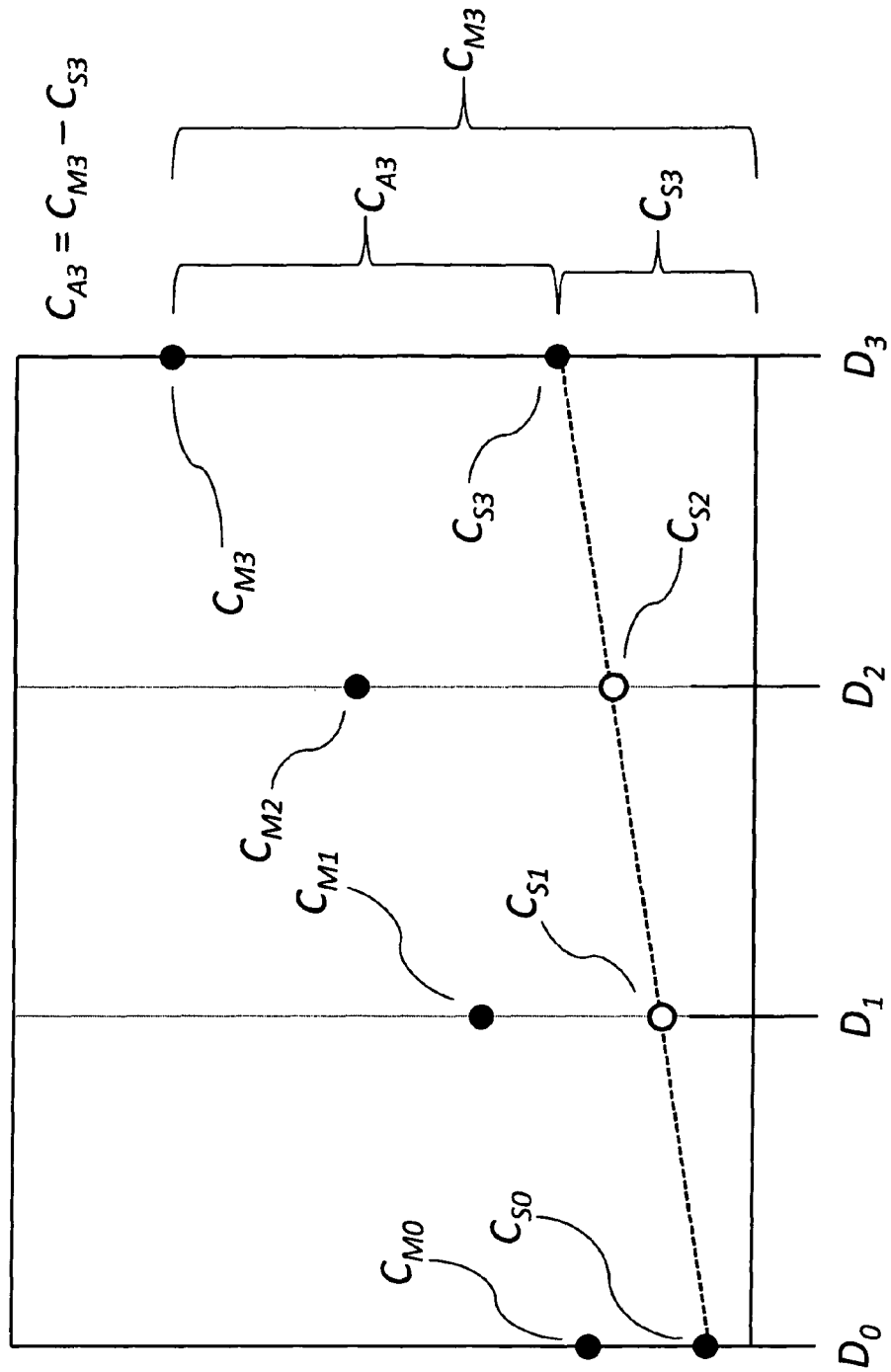

As shown in FIG. 10, two stationary-electrode capacitive sensors 200 take capacitance measurements $C_{S0}$ and $C_{S3}$, respectively; the remaining data points (including $C_{S1}$ and $C_{S2}$) are estimated through interpolation between capacitance measurements $C_{S0}$ and $C_{S3}$. The positively sloped dashed line is interpolated from measured stationary-electrode capacitance value $C_{S0}$ and $C_{S3}$. Every location on the linear-fit line (e.g., stationary-electrode capacitance values $C_{S1}$, $C_{S2}$, and $C_{S3}$), other than measured data points $C_{S0}$ and $C_{S3}$, is an extrapolated value of those measured data point.

Figure 11:
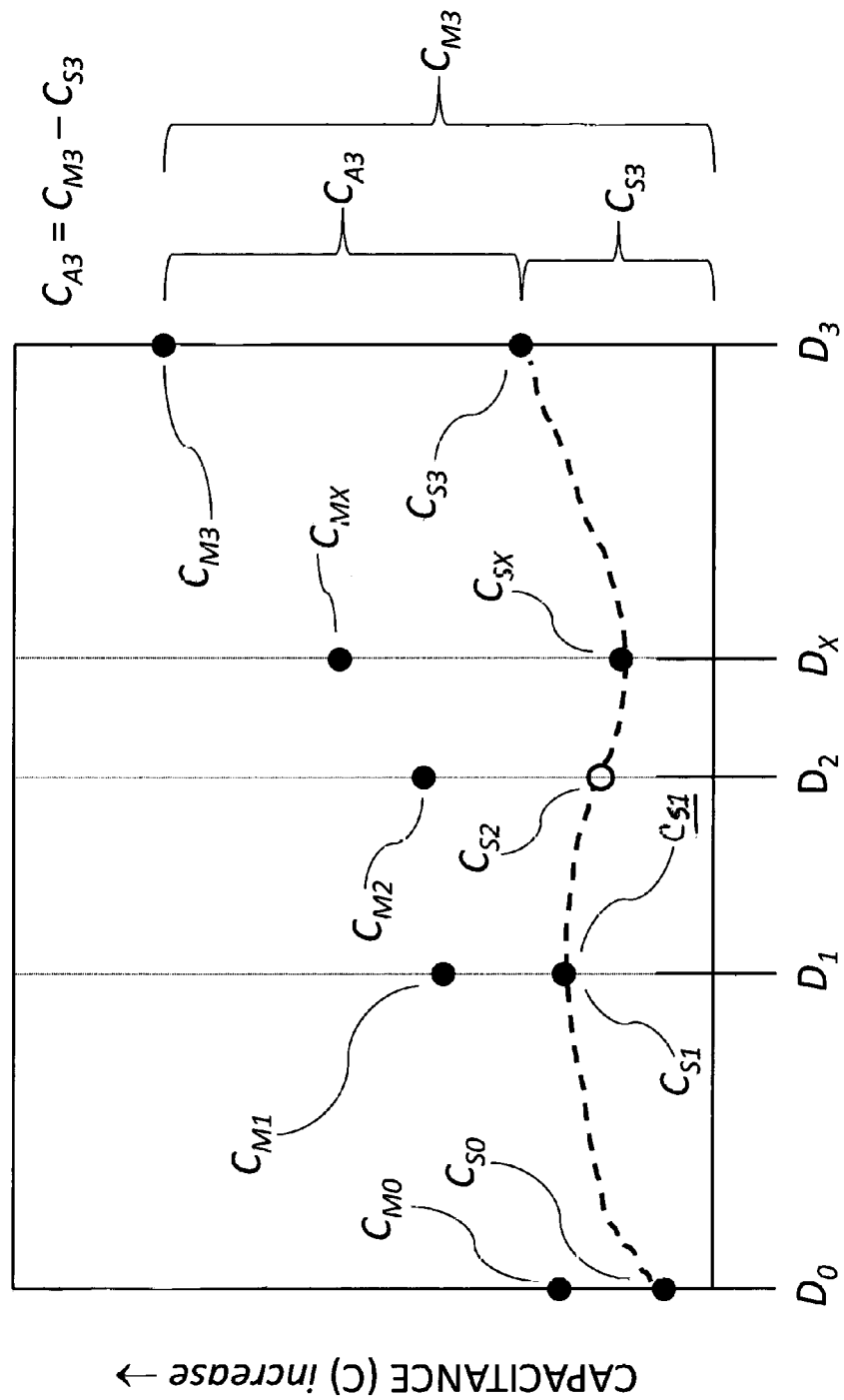

As shown in FIG. 11, four stationary-electrode capacitive sensor 200 take capacitance measurements $C_{S0}$, $C_{S1}$, $C_{S2}$, and $C_{S3}$, respectively the remaining data points are estimated through interpolation between or among capacitance measurements $C_{S0}$, $C_{S1}$, $C_{S2}$, and $C_{S3}$. The curved dashed line is interpolated from measured stationary-electrode capacitance value $C_{S0}$. Every location on the curved-fit line (e.g., stationary-electrode capacitance values $C_{S1}$, $C_{S2}$, and $C_{S3}$), other than measured data points $C_{S0}$, $C_{S1}$, $C_{S2}$, and $C_{S3}$, is an extrapolated value of at least two of those measured data points.

The skilled artisan who reads this disclosure will understand that, depending on the exemplary embodiment, the inventive practice involving plural stationary-electrode sensor components 200 may provide for (i) interpolation, or (ii) extrapolation, or (iii) both interpolation and extrapolation. For instance, note that stationary-electrode data points $C_{S0}$ and $C_{S3}$ in FIGS. 10 and 11 are at the extreme ends of the entire range of displacement, i.e., non-displacement ($C_{S0}$) and total displacement ($C_{S3}$). In-between values can be found through interpolation. Note that if, for instance, partial-displacement data points (e.g., $C_{S1}$ and $C_{S2}$) are measured, the entire range of displacement may be determined through a combination of extrapolation (ranging outward from $C_{S1}$ and $C_{S2}$ to the two opposite extremes) and interpolation (ranging inward between $C_{S1}$ and $C_{S2}$).

Figure 12:
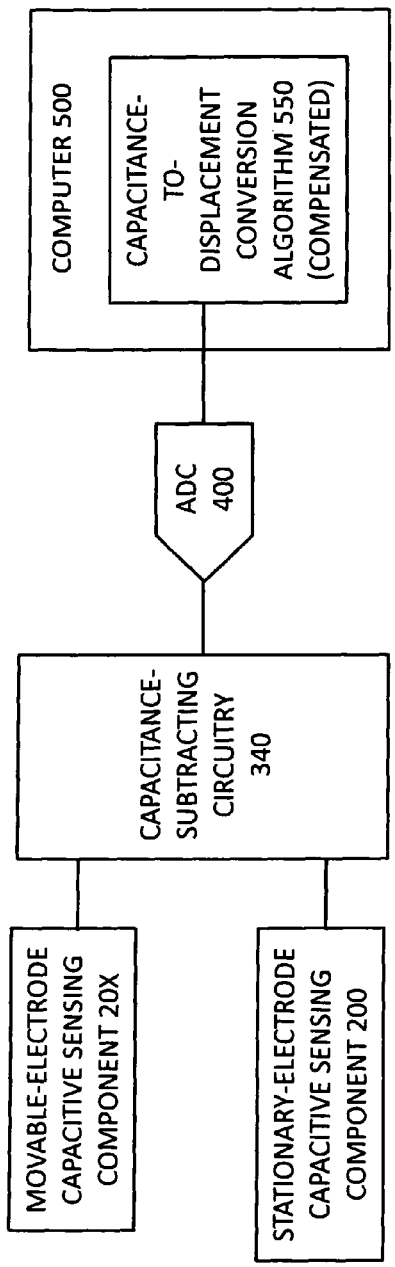
FIGS. 12 through 14 are schematics of various embodiments of practice in accordance with the present invention.
Figure 13:
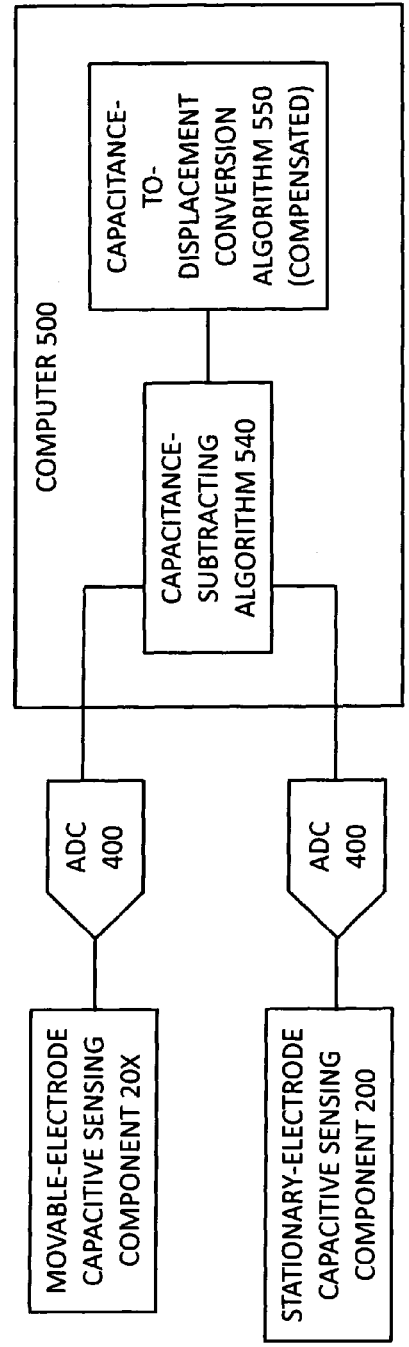

FIGS. 12 and 13 illustrate two different approaches to inventive determination of actual capacitance $C_A$ by exemplary single-reference inventive systems. As shown in FIG. 12, capacitance-subtracting circuitry 340 subtracts the capacitance measured by stationary-electrode sensor component 200 from the capacitance measured by movable-electrode sensor component 20X. This output is converted to digital form by an analog-to-digital converter (ADC) 400. Computer 500 (e.g., a microcontroller or microprocessor) has a processor and a memory, and executes algorithms resident in its memory. A computer is broadly defined herein as any programmable machine. A computer usually has a processor and a memory. By executing algorithm 550, computer 500 calculates the actual displacement from the actual capacitance $C_A$. As shown in FIG. 13, computer 500 (via algorithm 540) subtracts the capacitance measured by stationary-electrode sensor component 200 from the capacitance measured by movable-electrode sensor component 20X.

Figure 14:
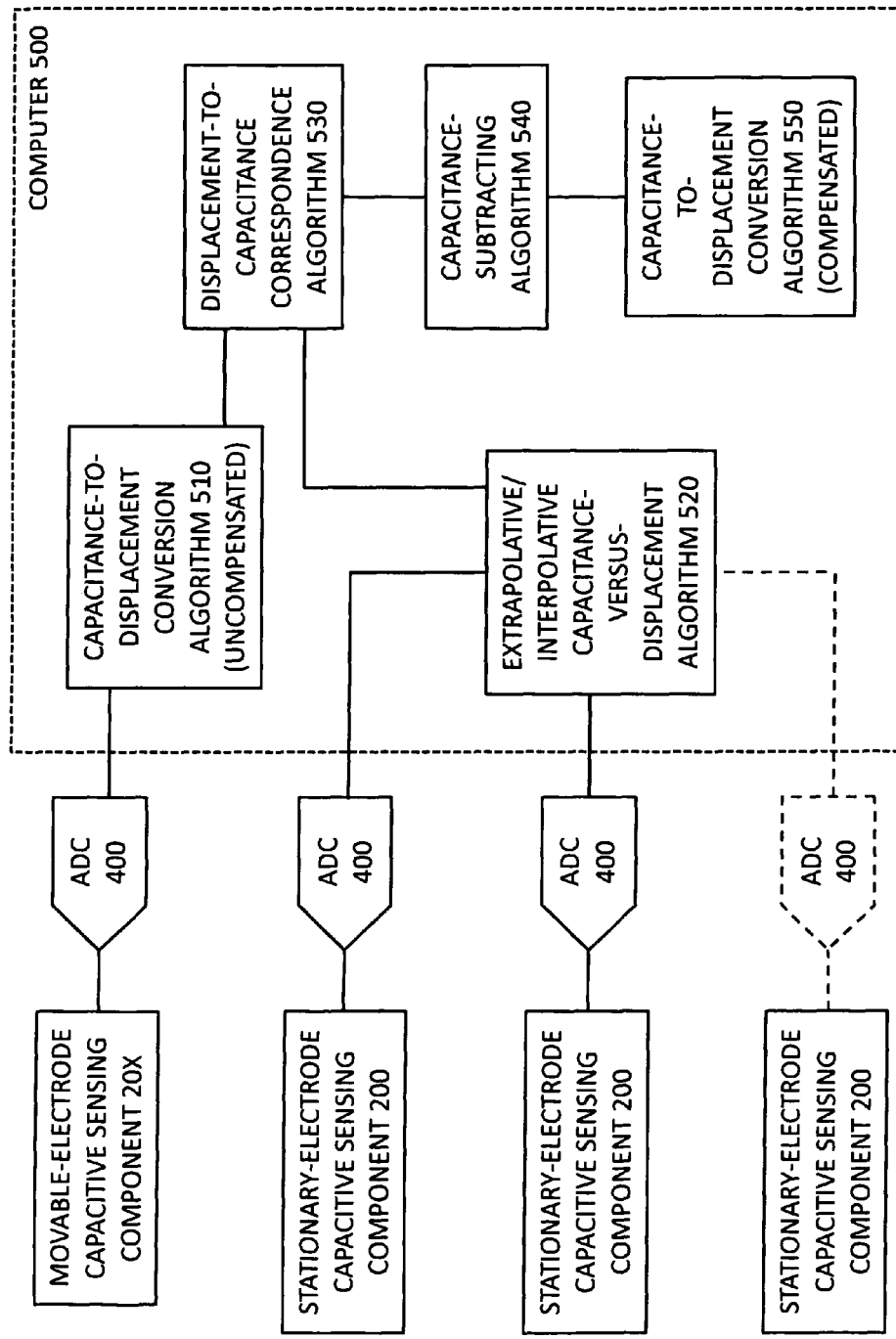
Figure 15:
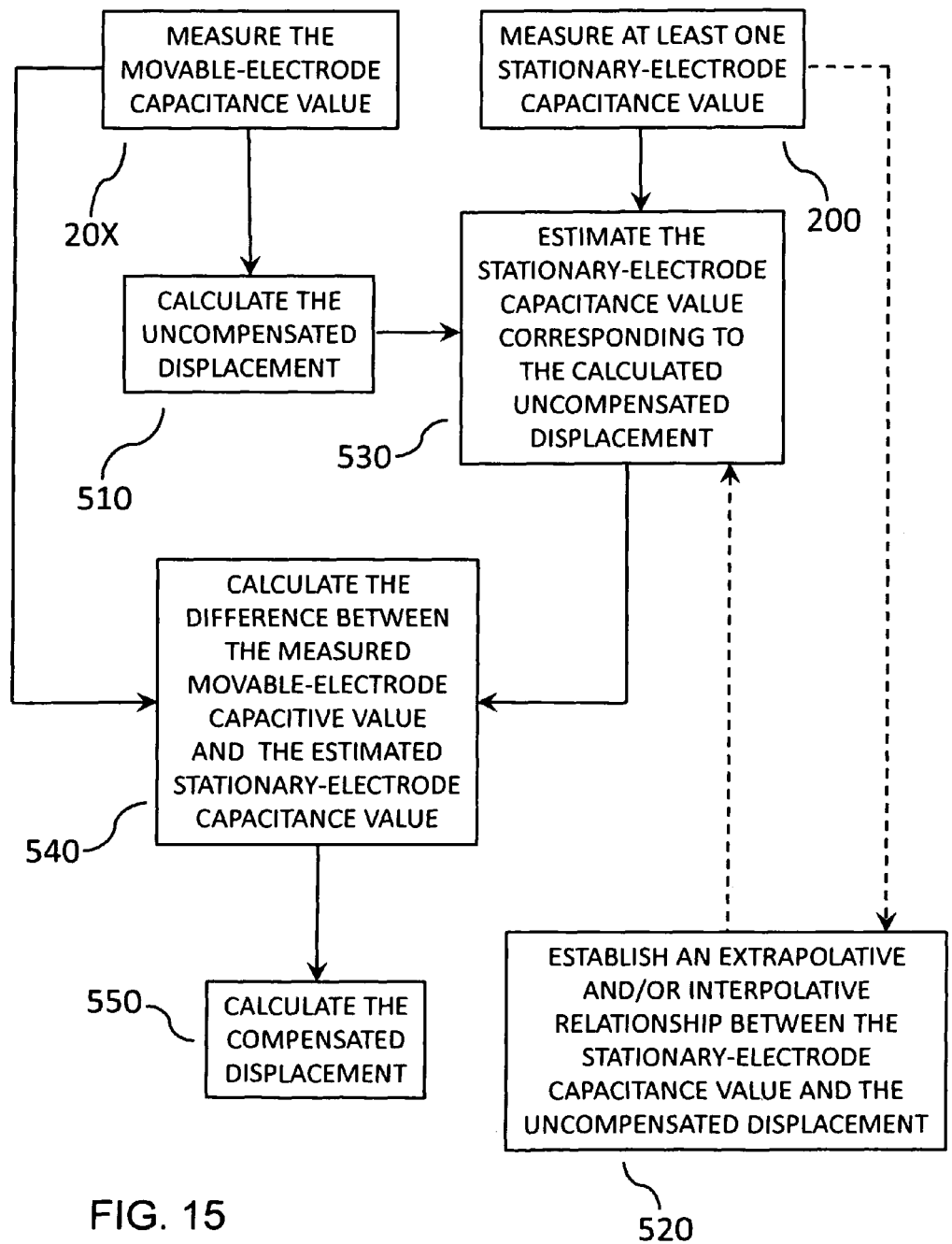
FIG. 15 is a flow diagram illustrating an exemplary practice in accordance with the present invention.

FIGS. 14 and 15 illustrate inventive determination of actual capacitance $C_A$ by exemplary multi-reference inventive systems. The capacitive measurements of movable-electrode component 20X and each of at least two stationary-electrode components 200 are amplified by corresponding ADCs 400, and then input into computer 500, which: (a) calculates the uncompensated displacement, i.e., the displacement calculated from the capacitance measured by movable-electrode sensor component 20X (algorithm 510); (b) establishes an extrapolative or interpolative relationship between the capacitances individually measured by stationary-electrode components 200, and the displacements calculated from the capacitances measured by movable-electrode sensor component 20X (algorithm 520); (c) estimates the capacitance measurement by the stationary-electrodes 200, based on (i) the result of algorithm 510, and (ii) the result of 520 (algorithm 530); (d) calculated the actual capacitance by subtracting the estimated capacitance (i.e., the result of algorithm 530) from the capacitance measured by the movable-electrode sensor component 20X (algorithm 540); and, (e) calculates the actual (compensated) displacement, i.e., the displacement based on the actual (compensated) capacitance (which is the result of algorithm 540).

As described in the preceding paragraph, the present invention is generally practiced to find the actual displacement from the difference in capacitances between (i) the capacitance measured by movable-electrode sensor component 20X, and (ii) the capacitance estimated from the measurements by the stationary-electrodes 200. Here, this difference in capacitances, i.e., the actual capacitance, is mathematically converted to the actual displacement. As an additional or alternative approach, the present invention can first calculate displacement from the capacitance estimated from the measurements by the stationary-electrode components 200. The actual displacement is then calculated from the difference between (i) the displacement calculated from the capacitance measured by movable-electrode sensor component 20X, and (ii) the displacement calculated from the capacitance estimated from the measurements by the stationary-electrodes 200.

The present invention will frequently be embodied so as to determine the actual displacement of an object as its actual displacement changes over time. The respective measurements of the movable-electrode sensor component 20X and the stationary-electrode sensor components 200 will vary, or be subject to variation, in accordance with changes in the actual displacement of the object. In this manner, inventive practice succeeds in determining, on a continual basis, the actual displacement of the object.

The present invention, which is disclosed herein, is not to be limited by the embodiments described or illustrated herein, which are given by way of example and not of limitation. Other embodiments of the present invention will be apparent to those skilled in the art from a consideration of the instant disclosure, or from practice of the present invention. For instance, a skilled artisan who reads this disclosure will be capable of selecting parameters such as numbers and characteristics of reference components, and will be capable of estimating reference capacitance values through various known mathematical techniques such as involving linear fits and curve (e.g., least-squares) fits. Various omissions, modifications, and changes to the principles disclosed herein may be made by one skilled in the art without departing from the true scope and spirit of the present invention, which is indicated by the following claims.

What is claimed is:

1. An environmentally compensated capacitive sensing device, comprising:
   a primary capacitive sensor; and
   a plurality of secondary capacitive sensors,
      wherein said primary capacitive sensor includes two electrode elements at least one of which is displaceable in accordance with displacement of a target object,
      wherein each of said plurality of secondary capacitive sensor includes two non-displaceable electrode elements,
      wherein sensing is performed by said primary capacitive sensor indicative of said displacement of said target object and of environmental influence upon the primary capacitive sensing device, and
      wherein sensing performed by said plurality of secondary capacitive sensors are indicative of said environmental influence.

2. The capacitive sensing device of claim 1, further comprising a computer capable
   of determining a difference between a measured electrical value and an estimated electrical value,
      wherein said measured electrical value is representative of said sensing performed by said primary capacitive sensor,
      wherein said estimated electrical value is representative of said sensing performed by at least two of said plurality of secondary capacitive sensors,
      wherein said estimated electrical value corresponds to said displacement of said target object of which said primary capacitive sensor is indicative, and
      wherein said difference reflecting sensing performed by said capacitive sensing device is indicative of said displacement of said target object and indicative of said environmental influence.

3. The capacitive sensing device of claim 2, wherein said estimated electrical value is found by a computer, which uses one of an interpolative technique and an extrapolative technique with respect to said sensing performed by said at least two of said plurality of secondary capacitive sensors.

4. The capacitive sensing device of claim 2, wherein said estimated electrical value is found
   by a computer, which uses one of an interpolative technique and an extrapolative technique with respect to said sensing performed by said at least two of said plurality of secondary capacitive sensors, and
      wherein said computer determines a compensated said displacement of said target object based on the determined said difference.

5. The capacitive sensing device of claim 1,
   wherein said primary capacitive sensor is a dynamic capacitive sensing component, which includes at least one said a dynamic pair of electrode elements,
   wherein said plurality of secondary capacitive sensors include at least two static capacitive sensing components where each includes a static pair of electrode elements, and wherein each of said static pair of electrode elements is immovable with respect to another one of said static pair of electrode elements.

6. The capacitive sensing device of claim 5,
   wherein said dynamic pair of electrode elements includes interdigitated electrode fingers that are variable in spatial relation to each other, wherein each of said static pair of electrode elements includes said interdigitated electrode fingers that are fixed in spatial relation to each other, and wherein each of said static pair of electrode elements provides a different displacement between its static pair of electrode elements.

7. The capacitive sensing device of claim 5, wherein said dynamic capacitive sensing component and said at least two static capacitive sensing components are substantially adjacent to each other.

8. The capacitive sensing device of claim 1, wherein the primary capacitive sensor includes at least two electrode elements, and wherein said plurality of secondary capacitive sensors include at least two non-displaceable electrode elements.

9. The capacitive sensing device of claim 1, wherein the computer includes a memory.

10. The capacitive sensing device of claim 1, wherein said primary capacitive sensor includes moveable elements, which include electrode fingers, and wherein said plurality of secondary capacitive sensors include stationary elements, which include stationary fingers.

11. The capacitive sensing device of claim 10, wherein each of said electrode fingers is situated between two said stationary fingers.

* * * * *